United States Patent [19]

Aoki et al.

[11] Patent Number: 4,979,187
[45] Date of Patent: Dec. 18, 1990

[54] PREDICTIVE CODING DEVICE

[75] Inventors: Akio Aoki; Yoshiki Ishii, both of Tokyo, Japan

[73] Assignee: Canon Kabushiki Kaisha, Tokyo, Japan

[21] Appl. No.: 332,040

[22] Filed: Apr. 3, 1989

[30] Foreign Application Priority Data

Apr. 6, 1988 [JP] Japan .................. 63-084254

[51] Int. Cl.⁵ .......................... H04B 14/06
[52] U.S. Cl. .......................... 375/27; 341/76
[58] Field of Search ........ 325/25, 27, 30, 33; 382/50; 341/51, 75, 76, 143; 358/13, 135, 138

[56] References Cited

U.S. PATENT DOCUMENTS

| | | | |
|---|---|---|---|
| 3,582,784 | 6/1971 | Gaunt, Jr. ........................... | 375/30 |
| 3,831,092 | 8/1974 | Greefkes ............................ | 375/33 |
| 4,519,073 | 5/1985 | Bertocci et al. .................. | 375/30 |
| 4,554,671 | 11/1985 | Collins ............................ | 375/30 |

FOREIGN PATENT DOCUMENTS 63-203535  8/1988  Japan .

Primary Examiner—Benedict V. Safourek
Attorney, Agent, or Firm—Fitzpatrick, Cella Harper & Scinto

[57] ABSTRACT

A predictive coding device includes: a limiter to limit an input value having a first dynamic range to a value within a second dynamic range narrower than the first dynamic range; a subtracter to calculate a differential value between an output value of the limiter and a predictive value; a quantization circuit to assign the same code to differential values which differ by a value which is equal to or larger than the second dynamic range and smaller than the first dynamic range; and a predictor to calculate a new predictive value by using an output of the quantization circuit. The quality of the code due to the limitation of the dynamic range is improved.

11 Claims, 5 Drawing Sheets

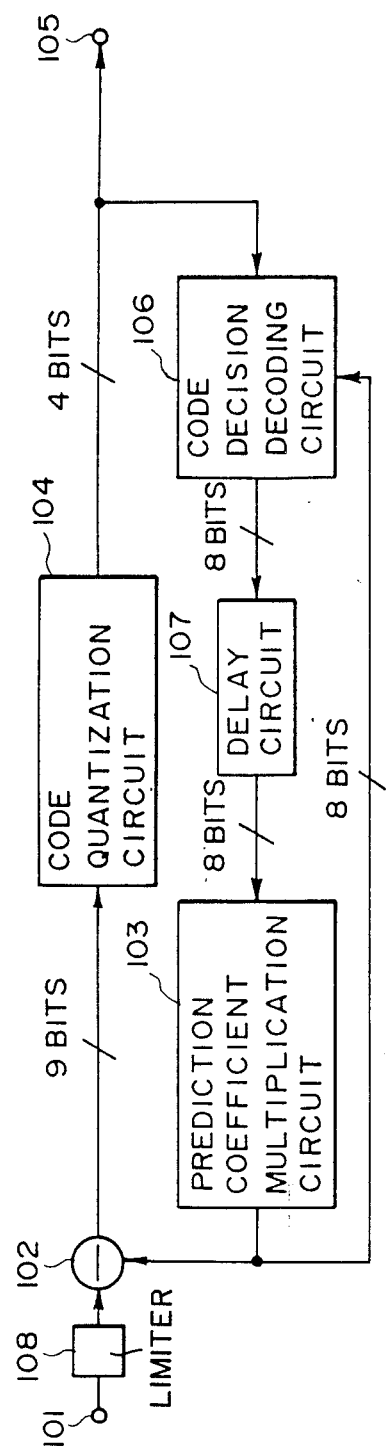
F I G. 2
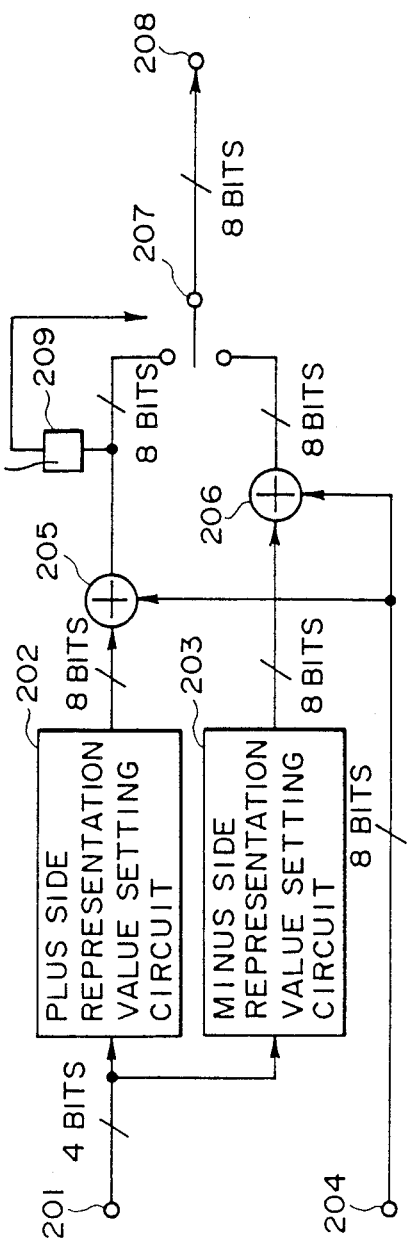
F I G. 3

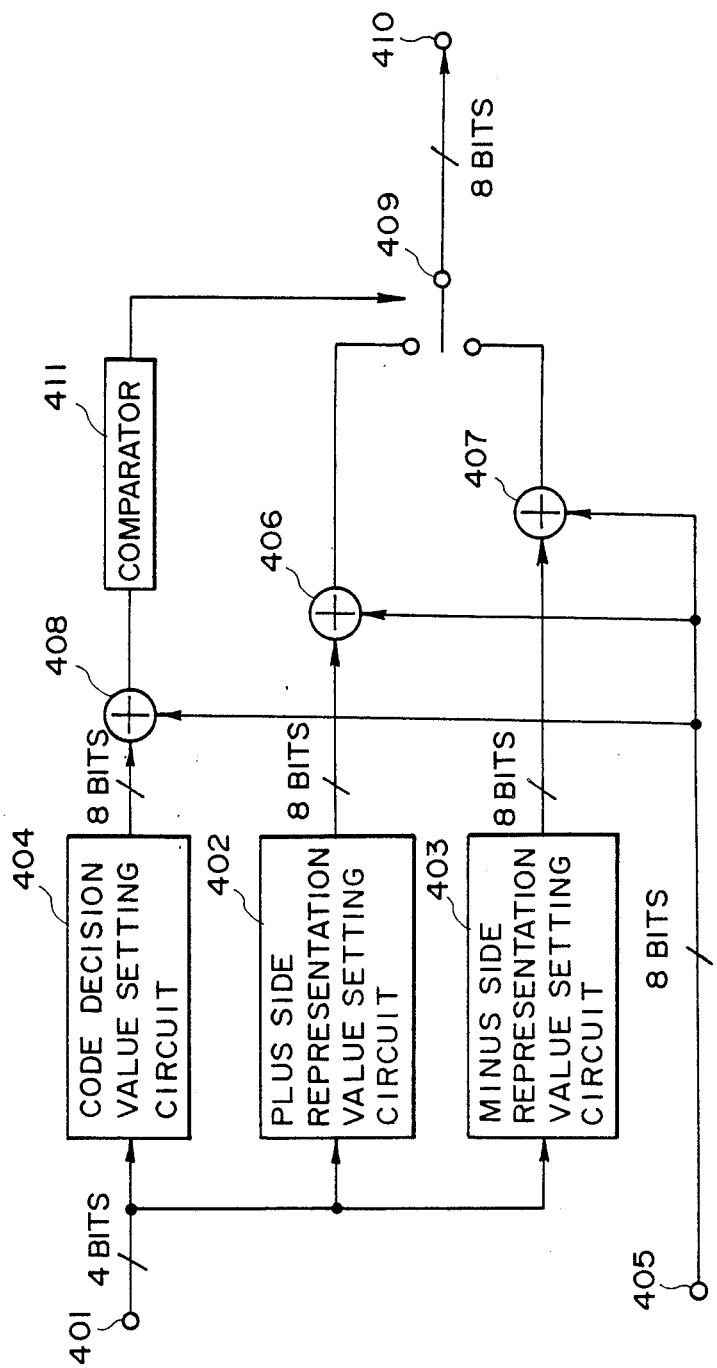
F I G. 5

PREDICTIVE CODING DEVICE

BACKGROUND OF THE INVENTION

1. Field of the Invention

The present invention relates to a predictive coding system for coding a differential value between an input value and a prediction value.

2. Related Background Art

Hitherto, as a high efficient coding system which is used in the case of transmitting data obtained by sampling a signal having a large information amount such as an image signal or the like, for instance, a differential PCM (Pulse Code Modulation) system (hereinafter, simply referred to as a DPCM) has generally been well known. The DPCM is the system in which a value of a sample point to be at present coded is predicted from the values of the sample points which have already been coded and the difference (prediction error) between the predictive value and the inherent value is coded. For a signal such as an image signal or the like in which a correlation among the; values at the close sample points is large, highly-efficient coding can be executed by performing the non-linear digitization in consideration of a deviation of the generation distribution of the prediction error signals or the like.

FIG. 1 shows a schematic arrangement of a conventional predictive coding circuit. An explanation will now be made with respect to a predicting method in the case of executing a preceding value prediction. A preceding value predictive coding circuit shown in FIG. 1 comprises: an input terminal 601; a subtracting circuit 602; a non-linear quantization circuit 603; a local decoding circuit 604; and an output terminal 609. A digitized information signal is input to the input terminal 601. An input value a is input to a plus terminal of the subtracting circuit 602. A preceding value predictive value c formed by the local decoding circuit 604 is input to a minus terminal of the subtracting circuit 602. As the result of the subtraction, a prediction error b between the input value a and the preceding value predictive value c is output. In the case where the input value a is obtained from an image signal, the non-linear quantization is executed in the non-linear quantization circuit 603 by using the fact that a distribution of the prediction errors b can be substantially approximated by a Laplace distribution. A code d is output to the local decoding circuit 604 and output terminal 609. The section shown by 604 and surrounded by a broken line denotes the local decoding circuit. A representation value setting circuit 608 in the local decoding circuit outputs a representation value e corresponding to each quantization step of the code d. By adding the representation value to the preceding value predictive value c by means of an adding circuit 607, a decoded value f of the code d is output and is delayed by, for instance, one sampling period of time by a delay circuit 606. Thereafter, a prediction coefficient a ($0 < a \leq 1$) is multiplied by the delayed output signal by a prediction co-efficient multiplication circuit 605 and a next preceding value predictive value c is formed. On the other hand, the decoding circuit can be realized by a construction similar to that of the local decoding circuit in the encoder shown in FIG. 6. The decoding can be executed by transmitting the value f to the output terminal.

The data which ordinarily consists of eight bits/sample (corresponding to a in FIG. 1) can be compressed into data consisting of 4 to 5 bits/ sample (corresponding to d in FIG. 1) by the predictive coding as described above and can be transmitted. The transmission bit rate can be reduced.

In recent years, the band of transmission signal has been widened more and more in association with the realization of a finer image signal. Due to such a wide band signal, it is desired to construct a coding system having a further high compression ratio. For this purpose, the assignee of the present invention has proposed a construction to realize the coding system of a further high compression ratio by a method whereby the same code is applied to a plurality of different differential values in Japanese Patent Application No. 62-36201, which has already been applied.

SUMMARY OF THE INVENTION

It is an object of the present invention to improve the system proposed above.

Another object of the invention is to provide a predictive coding device which can realize a still higher compression ratio.

Still another object of the invention is to provide a predictive coding device which can obtain a code which further accurately corresponds to an original signal without changing a compression ratio.

Under such objects, according to the present invention, as one embodiment, there is provided a predictive coding device comprising: (a) limiting means for limiting an input value having a first dynamic range into a value within a second dynamic range narrower than the first dynamic range; (b) subtracting means for forming a differential value between an output value of the limiting means and a predictive value; (c) quantizing means for receiving the differential value and outputting a coding code corresponding thereto, giving the same coding code to two differential values which differ by a value which is larger than the second dynamic range, and (d) predicting means for forming the predictive value (for the next use) by using the coding code which is output from the quantizing means.

The above and other objects and features of the present invention will become apparent, from the following detailed description of the preferred embodiment with reference to the accompanying drawings.

BRIEF DESCRIPTION OF THE DRAWINGS

FIG. 2 is a diagram showing a schematic construction of a coding device as an embodiment of the present invention;

FIG. 3 is a diagram showing a schematic construction of a code decision decoding circuit in FIG. 2;

FIG. 5 :s a diagram showing another schematic construction of the code decision decoding circuit in FIG. 2; and ,, FIG. 6 is a diagram showing a schematic construction of a decoding device corresponding to the devices in FIGS. 2 and 5.

DETAILED DESCRIPTION OF THE PREFERRED EMBODIMENTS

An embodiment of the present invention will be described hereinbelow with reference to the drawings.

Figure 1:
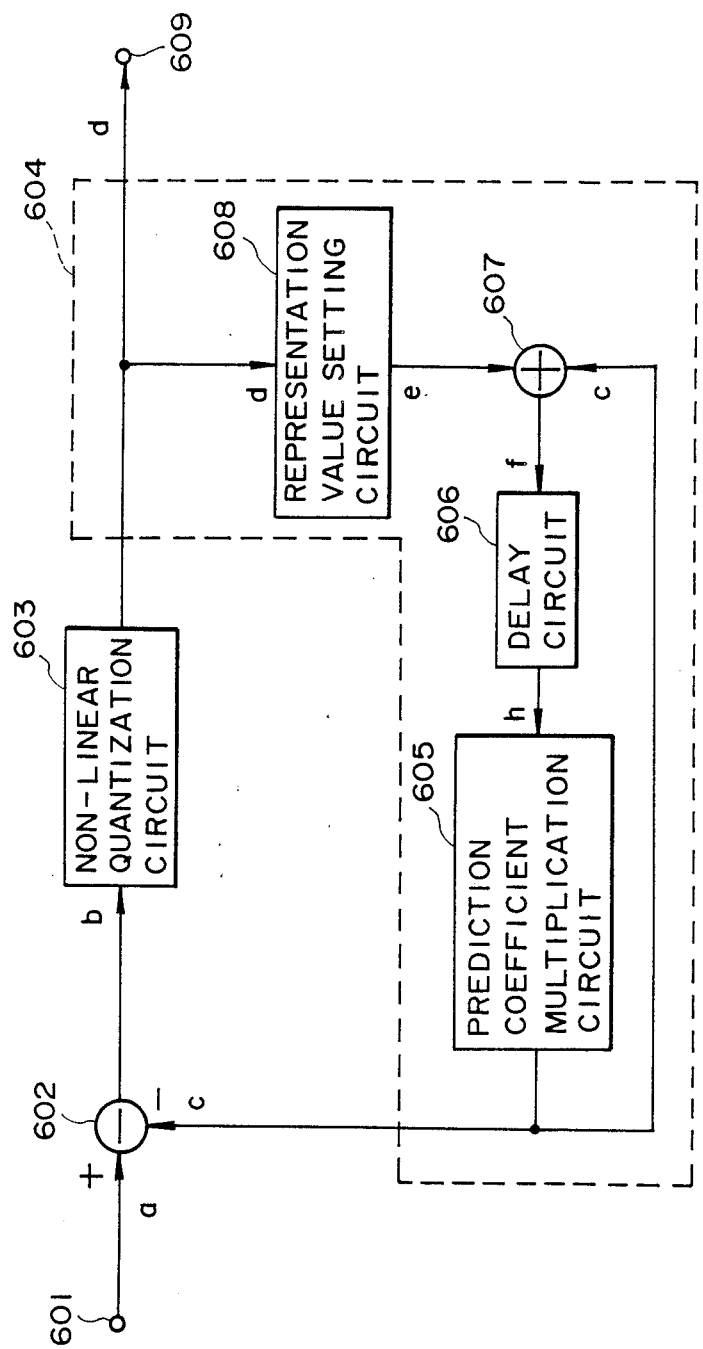
FIG. 1 is a diagram showing a schematic construction of a conventional predictive coding transmitting device.
Figure 4:
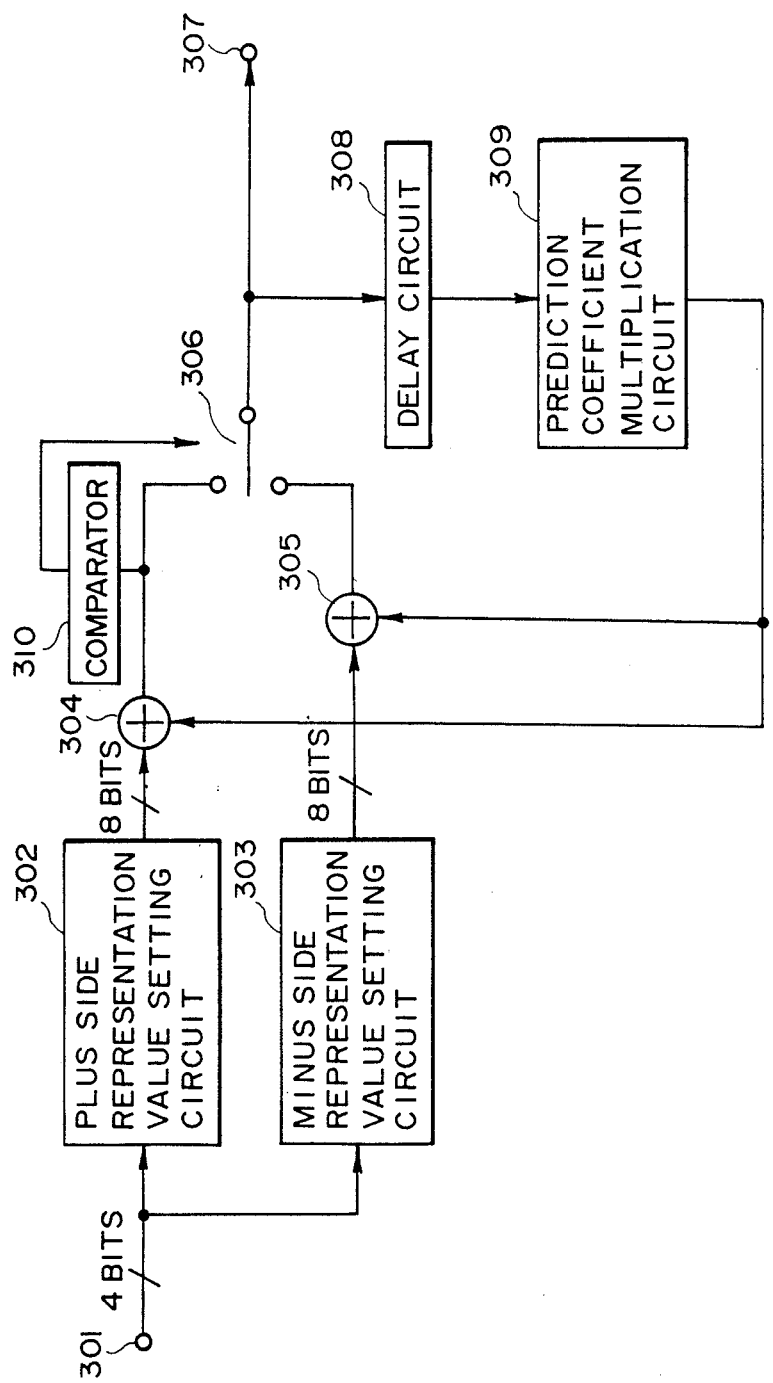
FIG. 4 is a diagram showing a schematic construction of a decoding device corresponding to the devices in FIGS. 2 and 3.

FIG. 2 is a diagram showing a schematic construction of a coding device for compressing data of eight bits into a code of four bits and transmitting the latter, as an embodiment of a predictive coding transmission system according to the invention. FIG. 3 is a diagram showing a schematic construction of a code decision decoding circuit in the coding device of FIG. 2. FIG. 4 shows a schematic construction of a decoding device for decoding the code obtained by the coding device.

In FIG. 2, image data of eight bits is input to an input terminal 101 and is limited to a value within a predetermined range of, for instance, 16 to 235 by a limiter 108. A differential value (predictive error) between the input value and a predictive value which is output from a prediction coefficient multiplication circuit 103 is calculated by a subtracting circuit 102. The predictive error is supplied to a code quantization circuit 104. The quantization circuit 104 quantizes the prediction error data of nine bits (including a code indicative of the plus or minus sign) into four bits on the basis of a quantizing characteristic in which the same code is assigned by overlaying the plus and minus signs as shown in Table 1 as an example. Then, the quantization circuit 104 outputs the result from an output terminal 105 and supplies it to a code decision decoding circuit 106.

The quantizing characteristic shown in Table 1 relates to an example of a table in which a discrimination is made by using the past decoded value to see if the prediction error having a value within a range from −219 to 219 has a plus sign or a minus sign and one representation value can be selected. By adding one code of four bits in a total of two quantizing steps consisting of one quantizing step of the plus sign and one quantizing step of the minus sign, the coding process due to the number of quantizing steps corresponding to five bits can be realized.

In such a table, plus and minus areas to be assigned to the same code are set so as to have the level difference corresponding to the dynamic range (for instance, 220) of the limited decoded value. The table is of the undershooting type in which the lower end of the region is set to a quantized representation value. Therefore, the results of the decoding due to the plus and minus representation values have the level difference of 220. In all cases, only one of the them lies within the dynamic range ("0 to 219"). Due to this, it is possible to decide whether the differential value has the plus sign or the minus sign as will be explained hereinlater. On the other hand, in the case of the image signal, the differential value near 0 is important. To realize the overlap of the non-linear characteristic, the characteristics on the plus and minus sides have a symmetrical structure in which they are folded back with respect to the center.

The code decision decoding circuit 106 decodes the code which is output from the quantization circuit 104 by using the predictive value as an output of the prediction coefficient multiplication circuit 103 and supplies the decoded value to a delay circuit 107. The decoded value is delayed by a predetermined period of time (for instance, one sampling period) by the delay circuit 107 and, thereafter, it is multiplied with a prediction coefficient by the prediction coefficient multiplication circuit 103 and is supplied as a prediction value to the subtracting circuit 102 and code decision decoding circuit 106.

TABLE 1

| Quantization value | plus side | | minus side | |
|---|---|---|---|---|
| | Region | Representation value | Region | Representation value |
| 0 | 0 | 0 | | |
| 1 | 1~4 | 1 | −219 | −219 |
| 2 | 5~10 | 5 | −218~−215 | −215 |
| 3 | 11~20 | 11 | −214~−209 | −209 |
| 4 | 21~35 | 21 | −208~−199 | −199 |
| 5 | 36~55 | 36 | −198~−184 | −184 |
| 6 | 56~79 | 56 | −183~−164 | −164 |
| 7 | 80~109 | 80 | −163~−140 | −140 |
| 8 | 110~139 | 110 | −139~−110 | −110 |
| 9 | 140~163 | 140 | −109~−80 | −80 |
| 10 | 164~183 | 164 | −79~−56 | −56 |
| 11 | 184~198 | 184 | −55~−36 | −36 |
| 12 | 199~208 | 199 | −35~−21 | −21 |
| 13 | 209~214 | 209 | −20~−11 | −11 |
| 14 | 215~218 | 215 | −10~−5 | −5 |
| 15 | 219 | 219 | −4~−1 | −1 |

The operation of the code decision decoding circuit 106 will now be described with reference to FIG. 3. The code multiplexed code of four bits which is output from the quantization circuit 104 is input to a terminal 201 and is supplied to a plus side representation value setting circuit 202 and a minus side representation value setting circuit 203. Plus and minus representation values as outputs of the setting circuits 202 and 203 are added to a prediction value which is supplied from a terminal 204 by adding circuits 205 and 206, respectively. The resultant values are supplied as plus and minus decoded values to a selecting circuit 207. Since the outputs of the representation value setting circuits 202 and 203 always keep the level difference of 220, one of the plus and minus decoded values which are supplied to the selecting circuit 207 is always out of the limited dynamic range of 16 to 235 in the range of eight bits ("0 to 255"). Therefore, between the plus and minus decoded values, by selecting one of them which lies within the dynamic range, the correct decoded value is obtained from the code multiplexed input. Therefore, the level of the decoded value data which is output from the plus side adding circuit 205 is compared with the threshold value 236 by a comparator 209. The selecting circuit 207 is controlled by a comparison output signal and one of the plus and minus decoded values is selected and output from a terminal 208.

The code deciding operation in the embodiment will now be described with respect to a practical example. There is now considered the case where the predictive value is 100 and the current input value is 150. Since the prediction error is "+50", the code multiplex quantization circuit 104 outputs 5 as the quantization value data of four bits as shown in Table 1. In the code decision decoding circuit 106, since the plus side decoded value data is 136 and the minus side decoded value data is −84, the data of 136 within the proper dynamic range is selected as the decoded value. In a manner similar to the above, when the current input value is 50 and the prediction error is "50", "11" is output from the quantization circuit 104. In this case, since the plus side decoded value data is 284 and the minus side decoded value data is 64, 64 within the proper dynamic range is selected.

A decoding device to decode the code which had been coded by the coding device shown in FIG. 2 and been transmitted will now be described with reference to FIG. 4. The code of four bits which was coded by the coding device is input to an input terminal 301 and is supplied to a plus side representation value setting circuit 302 and a minus side representation value setting circuit 303. Plus and minus representation values as outputs of the setting circuits 302 and 303 are added to a predictive value which is supplied from a prediction coefficient multiplication circuit 309 by adding circuits 304 and 305, respectively, and the resultant values are supplied as decoded values on the plus and minus sides to a selecting circuit 306. Since the outputs of the representation value setting circuits 302 and 303 always keep the level difference of 256 due to the characteristic of the code, one of the plus and minus decoded values which are supplied to the selecting circuit 306 is always out of the limited dynamic range of 16 to 235. Therefore, between the plus and minus decoded values, by selecting one of them within the proper dynamic range, the correct decoded value of the code is obtained. Therefore, the decoded value which is output from the plus side adding circuit 304 is compared with the threshold value 236 by a comparator 310. The selecting circuit 306 is controlled by a comparison output signal and one of the plus and minus decoded values is selected and the decoded value of eight bits is output from an output terminal 307. On the other hand, the decoded value is supplied to a delay circuit 308 and is delayed by one sampling period of time and is transmitted to the prediction coefficient multiplication circuit 309. The prediction coefficient multiplication circuit 309 multiplies a prediction coefficient to the delayed decoded value and calculates a predictive value and supplies to the adding circuits 304 and 305 to decode an input code which are arranged at the post stage. The decoding device can be realized by the construction as mentioned above.

As another embodiment of the invention, an example of a coding device using a code decision representation value other than the plus and minus quantization representation values will now be described with respect to the example in which an input signal consists of eight bits and an output signal consists of four bits in a manner similar to the above.

Figure 6:
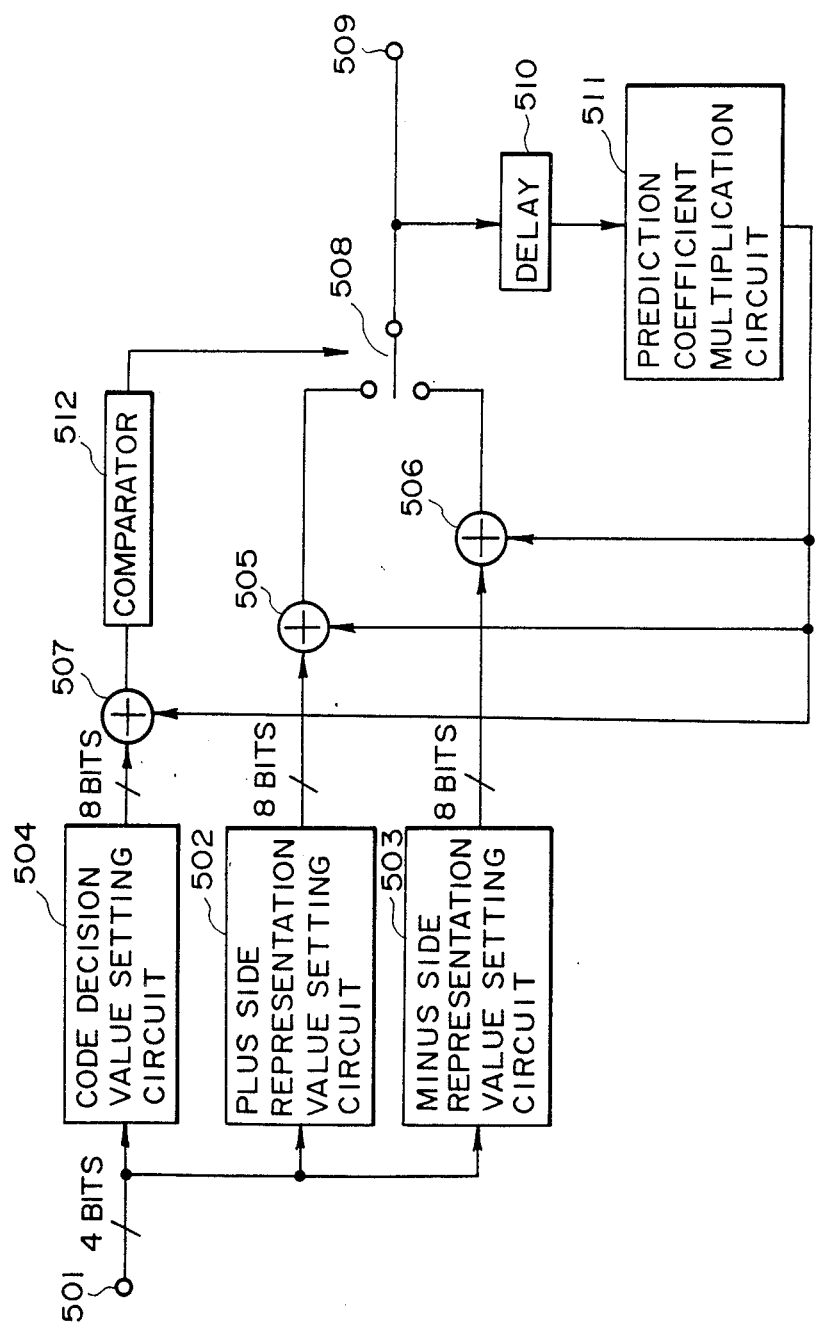

A schematic construction of the whole coding device is also shown in FIG. 2 similarly to the forgoing embodiment. Table 2 shows the characteristic of a coding multiplex quantization circuit different from that in the foregoing embodiment. A schematic construction of a code decision decoding circuit is shown in FIG. 5. A schematic construction of a decoding device which can be used therewith is shown in FIG. 6.

In the quantizing characteristic shown in Table 2, in addition to the code deciding operation realized by Table 1 in the foregoing embodiment, in Table 1, the quantization representation value limited to the lower end in the divided region can be arbitrarily selected in each of the divided region. Therefore, the plus and minus tables are overlaid by providing the level difference of 220 and the resultant table is shifted by one level. The minimum level difference (from the upper end on the minus side to the lower end on the plus side) of two plus and minus regions which are assigned to the same code is set to 220 or more. In this case, it is sufficient to use the result of the addition of the end portions of the regions in order to decide the code. The lower end in the divided region on the plus side is called a code decision value.

FIG. 5 shows a code decision decoding circuit using the plus and minus representation values and code decision values shown in Table 2. A code multiplexed code of four bits from a terminal 401 is supplied to plus and minus side representation value setting circuits 402 and 403 and a code decision value setting circuit 404. Outputs of the setting circuits 402 to 404 are added to a predictive value which is supplied from a terminal 405 by adding circuits 406, 407, and 408, respectively. The plus and minus decoded values are supplied from the adding circuits 406 and 407 to a selecting circuit 409. The result of the addition of the code decision value and the predictive value is output from the adding circuit 408 and is compared with the threshold value 236 by a comparator 411. The selecting circuit 409 selects one of the plus and minus code values as an output in response to a comparison output signal of the comparator 411 on the basis of the code decision principle similar to that mentioned in the foregoing embodiment. The selected code value is output from a terminal 410.

TABLE 2

| Quantization value | plus side Region | Representation value | minus side Region | Representation value | Code decision value |
|---|---|---|---|---|---|
| 0 | 0 | 0 | | | 0 |
| 1 | 1~2 | 1 | | | 0 |
| 2 | 3~7 | 5 | −219~−217 | −217 | 3 |
| 3 | 8~17 | 13 | −216~−212 | −215 | 8 |
| 4 | 18~31 | 25 | −211~−202 | −207 | 18 |
| 5 | 32~51 | 42 | −201~−188 | −195 | 32 |
| 6 | 52~77 | 64 | −187~−168 | −178 | 52 |
| 7 | 78~109 | 94 | −167~−142 | −155 | 78 |
| 8 | 110~141 | 126 | −141~−110 | −126 | 110 |
| 9 | 142~167 | 155 | −109~−78 | −94 | 142 |
| 10 | 168~187 | 178 | −77~−52 | −64 | 168 |
| 11 | 188~201 | 195 | −51~−32 | −42 | 188 |
| 12 | 202~211 | 207 | −31~−18 | −25 | 202 |
| 13 | 212~216 | 215 | −17~−8 | −13 | 212 |
| 14 | 217~219 | 217 | −7~−3 | −5 | 217 |
| 15 | | | −2~−1 | −1 | 220 |

The code deciding operation in the embodiment will now be described with respect to a practical example. The case where the predictive value is 100 and the current input value is 150 will now be considered. Since the prediction error is "50", the code multiplex quantization circuit 104 outputs 5 as a code of four bits as shown in Table 2. In the code decision decoding circuit 106, since the code decision value is 32 and the result of the addition lies within the dynamic range, the plus side decoded value is determined to be correct and 142, of the plus side decoded value, is selected. Similarly, when the current input value is 50, since the prediction error is −50, 11 is output as a code from the quantization circuit 104. In such a case, the code decision value is 188 and the result of the addition exceeds the dynamic range, so that a carry signal is generated and 58, the minus side decoded value, is selected.

A decoding device suitable for use with an embodiment will now be explained with reference to FIG. 6.

The code obtained by the coding device in the second embodiment is input to an input terminal 501 and is supplied to plus and minus side representation value setting circuits 502 and 503 and a code decision value setting circuit 504. Outputs of the setting circuits 502 to 504 are added to a predictive value which is supplied from a prediction coefficient multiplication circuit 511 by adders 505, 506, and 507, respectively. Plus and minus decoded values are supplied from the adders 505 and 506 to a selecting circuit 508. The result of the addition of the code decision value and the predictive value is output from the adding circuit 507. The selecting circuit 508 selects one of the plus and minus decoded values as an output according to the carry signal of the result of the addition on the basis of the code decision principle similar to that mentioned in the foregoing embodiment. The selected decoded value is output from an output terminal 509. In a manner similar to the above, the decoded value is supplied to a delay circuit 510 and is delayed by one sampling period of time and is transmitted to the prediction coefficient multiplication circuit 511. The prediction coefficient multiplication circuit 511 multiplies the prediction coefficient to the delayed decoded value and calculates the predictive value and supplies to the adding circuits 505, 506, and 507 to decode the code which are arranged at the post stage. The decoding device can be realized by the above construction.

Although the embodiment has been described with respect to the case where the digital information data of eight bits is compressed and coded into four bits and is transmitted, the number of bits can be set to any proper value. By providing A/D and D/A converters at the input and output stages, they can be obviously used to compress an analog signal. The code multiplex quantizing, characteristics shown in Tables 1 and 2 are not limiting but can be arbitrarily set if as long as they satisfy the code deciding principle mentioned above.

On the other hand, in the case where the data of eight bits which is input to the input terminal 101 is band limited, a representation value can be decided by setting in a manner such that two plus and minus divided regions which are assigned to the same code in the code multiplex quantization circuit have the level difference corresponding to the dynamic range (smaller than 220) after completion of the band limitation.

In general, in the case of assigning the same code to two differential values which differ by only the value corresponding to the dynamic range, it is necessary to set the quantizing steps in accordance with the significant one of the two differential values. Therefore, there can occur a case where even a value which is not important at all is quantized by relatively fine quantizing steps. Therefore, if the dynamic range of the input value is controlled as in the foregoing embodiment, the value which does not need to be finely quantized is not quantized. Thus, the quantizing steps in the dynamic range are reduced and the code which accurately corresponds to the original signal is derived. On the other hand, no problem occurs even if the value out of the limit dynamic range is replaced with the maximum or minimum value in the limit dynamic range in dependence on a low generating probability.

As described above, according to the invention, it is possible to provide a predictive coding system which can improve the quality of the coded information without increasing the transmission bit rate.

What is claimed is:
1. A predictive coding device comprising:
 (a) limiting means for limiting an input value having a first dynamic into a value within a second dynamic range narrower than said first dynamic range;
 (b) subtracting means for forming a differential value between an output value of said limiting means and a predictive value;
 quantizing means for receiving said differential value and outputting a coding code corresponding to said received differential value, said quantizing means outputting the same coding code for two differential values which are different from each other by a value larger than said second dynamic range; and
 (d) predicting means for forming said predictive value by using the coding code which is output from said quantizing means.

2. A device according to claim 1, wherein said predicting means includes:
 representation value setting means for outputting two quantization representation values corresponding to the coding code which is output from said quantizing means.
 local decoding means for outputting two local decoded values by adding each of said two quantization representation values and said predictive value; and
 switching means for selectively outputting said two local decoded values.

3. A device according to claim 2, wherein said predicting means further includes comparing means for comparing one of said two local decoded values with a predetermined value corresponding to one end of said second dynamic range and for outputting a control signal to control said switching means in accordance with the result of the comparison.

4. A device according to claim 1, wherein said quantizing means outputs two different coding codes for plus and minus differential values whose absolute values are less than or equal to a predetermined value.

5. A device according to claim 4, wherein said predicting means includes:
 representation value setting means for outputting two quantization representation values corresponding to the coding code which is output from said quantizing means;
 local decoding means for outputting two local decoded values by adding each of said two quantization representation values and said predictive value; and
 switching means for selectively outputting said two local decoded values.

6. A device according to claim 5, wherein said predicting means further includes:
 means for outputting a code decision value corresponding to one end of quantizing areas of the coding code which is output from said quantizing means;
 adding means for adding said code decision value and said predictive value; and
 comparing means for comparing an output value output from said adding means with a predetermined value corresponding to one end of said second dynamic range and for outputting a control signal to control said switching means in accordance with the result of the comparison.

7. A device according to claim 1, wherein said quantizing means outputs the same coding code by small quantizing steps for two differential values one of which is close to 0 and outputs the same coding code by large quantizing steps for two differential values both of which are not close to 0.

8. A device according to claim 1, wherein said input value is a sampled value which is obtained by sampling a video signal.

9. A predictive coding device comprising:
 (a) a limiter for limiting an input value having a first dynamic range into a value within a second dynamic range which is narrower than said first dynamic range;

(b) a subtractor to form a differential value between an output value to said limiter and a predictive value;

(c) a quantization circuit for receiving said differential value and outputting a coding code corresponding to said received differential value, said quantizing means outputting the same coding code for two differential values which are different from each other by a value larger than said second dynamic range;

(d) a representation value setting circuit for outputting two quantiziation representation values corresponding to the coding code which is output from said quantiziation circuit;

(e) a local decoder for outputting two local decoded values by adding each of said two quantization representation values and said predictive value;

(f) a selector for selectively outputting said two local decoded value; and (g) a predicting circuit for outputting said predictive value by using an output of said selector.

10. A predictive decoding device for decoding a coded code which is obtained by quantizing, using a quantization circuit, a differential value between a value in which an input value having a first dynamic range is limited to a value within a second dynamic range narrower than said first dynamic range and a predictive value, to give same code for two differential values which are different from each other by an amount which is larger than the second dynamic range, said predictive decoding device comprising:

(a) a representation value setting circuit for outputting two quantization representation values corresponding to said coding code;

(b) a local decoder for outputting two local decoded values corresponding to said input value by adding each of said two quantization representation values and a decoded predictive value;

(c) a selector for selectively outputting said two local decoded values, and (d) a predicting circuit for outputting said decoded predictive value by using an output of said selector.

11. A predictive coding and decoding device comprising:

(a) limiting means for limiting an input value having a first dynamic range to a value within a second dynamic range narrower than said first dynamic range;

(b) subtracting means for forming a differential value between an output value of said limiting means and a predictive value;

(c) quantizing means for receiving said differential value and outputting a coding code corresponding to said received differential value, said quantizing means outputting the same coding code for two differential values which are different from each other by a value larger than the second dynamic range;

(d) predicting means for forming said predictive value by using an output of said quantizing means;

(e) representation value setting means for outputting two quantiziation representation values corresponding to said coding code;

(f) decoding means for outputting two decoded values by adding each of said two quantization representation values and a decoded predictive value;

(g) switching means for selectively outputting said two decoded values; and (h) decoding and predicting means for outputting said decoded predictive value by using an output of said selector.

* * * * *

UNITED STATES PATENT AND TRADEMARK OFFICE
CERTIFICATE OF CORRECTION

PATENT NO. : 4,979,187

DATED : December 18, 1990

INVENTOR(S) : AKIO AOKI, ET AL.

It is certified that error appears in the above-identified patent and that said Letters Patent is hereby corrected as shown below:

On the title page:

IN [56] REFERENCES CITED

After Attorney, Agent, or Firm, "Fitzpatrick, Cella Harper & Scinto" should read --Fitzpatrick, Cella, Harper & Scinto--.

COLUMN 1

Line 10, "high" should read --highly- --.
Line 22, "the;" should read --the--.

COLUMN 2

Line 37, "range," should read --range;--.
Line 42, "apparent," should read --apparent--.
Line 58, ":s" should read --is--.
Line 60, "and,," should read --and--.

COLUMN 4

Line 37, "eight bits ("0 to 255")." should read --eight bits (0 to 255).--.
Line 52, ""+50"," should read --+50,--.
Line 60, ""50", "11"" should read -- -50, 11--.

COLUMN 5

Line 31, "supplies" should read --supplies it--.
Line 56, "region." should read --regions.--.

UNITED STATES PATENT AND TRADEMARK OFFICE
CERTIFICATE OF CORRECTION

PATENT NO. : 4,979,187
DATED : December 18, 1990
INVENTOR(S) : AKIO AOKI, ET AL.

It is certified that error appears in the above-identified patent and that said Letters Patent is hereby corrected as shown below:

COLUMN 6

Line 44, ""50"," should read --+50,--.
    Line 49, "of" should be deleted.
    Line 57, "with an" should read --with such an--.

COLUMN 7

Line 15, "supplies" should read --supplies it--.
    Line 16, "code" should read --codes--.
    Line 26, "ing," should read --ing--.
    Line 27, "if" should be deleted.
    Line 61, "first dynamic" should read
        --first dynamic range--.
    Line 66, "quantizing means" should read
        --(c) quantizing means--.

COLUMN 9

Line 3, "subtractor" should read --subtracter--.
    Line 4, "to" should read --of--.
    Line 15, "quantiziation" should read --quantization--.
    Line 17, "quantiziation" should read --quantization--.
    Line 22, "value;" should read --values;--.
    Line 31, "same code" should read --a same code--.

UNITED STATES PATENT AND TRADEMARK OFFICE
CERTIFICATE OF CORRECTION

PATENT NO. : 4,979,187

DATED : December 18, 1990

INVENTOR(S) : AKIO AOKI, ET AL.

It is certified that error appears in the above-identified patent and that said Letters Patent is hereby corrected as shown below:

COLUMN 10

Line 28, "quantiziation" should read --quantization--.

Signed and Sealed this

Eleventh Day of August, 1992

Attest:

DOUGLAS B. COMER

Attesting Officer

Acting Commissioner of Patents and Trademarks